US012217198B2

United States Patent
Sahay et al.

(10) Patent No.: US 12,217,198 B2
(45) Date of Patent: *Feb. 4, 2025

(54) METHOD AND SYSTEM FOR PROCESS SCHEDULE RECONCILIATION USING MACHINE LEARNING AND ALGEBRAIC MODEL OPTIMIZATION

(71) Applicant: AspenTech Corporation, Bedford, MA (US)

(72) Inventors: Nihar Sahay, Houston, TX (US); Dimitrios Varvarezos, Houston, TX (US)

(73) Assignee: AspenTech Corporation, Bedford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/111,273

(22) Filed: Dec. 3, 2020

(65) Prior Publication Data

US 2022/0180295 A1 Jun. 9, 2022

(51) Int. Cl.
*G06Q 10/0631* (2023.01)
*G05B 13/04* (2006.01)
(Continued)

(52) U.S. Cl.
CPC ..... *G06Q 10/063116* (2013.01); *G05B 13/04* (2013.01); *G05B 13/042* (2013.01);
(Continued)

(58) Field of Classification Search
CPC ....... G06Q 10/063116; G06Q 10/0633; G06Q 10/04; G06Q 50/04; G05B 13/042;
(Continued)

(56) References Cited

U.S. PATENT DOCUMENTS

| 5,873,251 A * | 2/1999 | Iino | ........................ F01K 13/02 60/660 |
| 6,795,798 B2 * | 9/2004 | Eryurek | ............. G05B 23/0254 700/29 |

(Continued)

FOREIGN PATENT DOCUMENTS

| WO | 2004/040386 A1 | 5/2004 |
| WO | 2009/026279 A1 | 2/2009 |

(Continued)

OTHER PUBLICATIONS

T. Lauer and S. Legner, "Plan instability prediction by machine learning in master production planning," 2019 IEEE 15th International Conference on Automation Science and Engineering (CASE), 2019, pp. 703-708, doi: 10.1109/COASE.2019.8842918. (Year: 2019).*

(Continued)

*Primary Examiner* — Crystol Stewart
(74) *Attorney, Agent, or Firm* — Hamilton, Brook, Smith & Reynolds, P.C.

(57) ABSTRACT

A computer-implemented method and system for process schedule reconciliation receives a scheduling model and an initial schedule for reconciliation, where the initial schedule includes projected plant data. Current plant data is imported into the system, and dynamic optimization data representing trends in process data at time-varied values for key process and operation parameters are identified. The current plant data and projected plant data is processed using mathematical modeling techniques to identify event boundaries, stream flowrates associated with tanks and process units. The system builds an optimization model applying identified event boundaries, stream flowrates, dynamic optimization data, key scheduling parameters and pre-determined constraints along a period of time that includes priority slots to reconcile the projected plant data of the initial schedule with (Continued)

the current plant data, and then solves the optimization model to develop a reconciled schedule.

**15 Claims, 17 Drawing Sheets
(5 of 17 Drawing Sheet(s) Filed in Color)**

(51) Int. Cl.
  *G05B 23/02* (2006.01)
  *G06F 30/20* (2020.01)
  *G06Q 10/04* (2023.01)
  *G06Q 10/0633* (2023.01)

(52) U.S. Cl.
  CPC ......... *G05B 23/0245* (2013.01); *G06F 30/20* (2020.01); *G06Q 10/04* (2013.01); *G06Q 10/0633* (2013.01)

(58) Field of Classification Search
  CPC ............................ G05B 13/04; G05B 13/0265; G05B 23/0294; G05B 2219/31449; G05B 19/41865; G06F 30/20
  See application file for complete search history.

(56) References Cited

U.S. PATENT DOCUMENTS

| | | | |
|---|---|---|---|
| 9,268,326 B2* | 2/2016 | Treiber | G06Q 10/06395 |
| 10,180,680 B2* | 1/2019 | Horn | G05B 13/04 |
| 10,816,965 B2* | 10/2020 | Yamamoto | G06Q 10/08 |
| 11,774,924 B2 | 10/2023 | Sahay et al. | |
| 2009/0198350 A1* | 8/2009 | Thiele | G05B 13/048 700/83 |
| 2009/0216574 A1* | 8/2009 | Nuszen | G06Q 10/063 382/141 |
| 2011/0060443 A1* | 3/2011 | Schwarm | G05B 13/042 700/104 |
| 2012/0010758 A1* | 1/2012 | Francino | G05B 17/02 700/291 |
| 2012/0083914 A1* | 4/2012 | Kocis | G05B 13/04 700/100 |
| 2012/0095574 A1* | 4/2012 | Greenlee | G05B 23/0283 700/297 |
| 2012/0296690 A1 | 11/2012 | Varvarezos et al. | |
| 2013/0179235 A1* | 7/2013 | Treiber | G05B 13/042 705/7.41 |
| 2014/0379112 A1* | 12/2014 | Kocis | G05B 17/02 700/97 |
| 2015/0100138 A1* | 4/2015 | Laflen | H04Q 9/00 700/29 |
| 2017/0083028 A1 | 3/2017 | Wu et al. | |
| 2017/0174512 A1* | 6/2017 | Oates | C01B 3/02 |
| 2017/0364043 A1* | 12/2017 | Ganti | G05B 17/02 |
| 2019/0258234 A1* | 8/2019 | Kaye | G05B 19/41885 |
| 2019/0266575 A1* | 8/2019 | McAdam | G06Q 10/06312 |
| 2019/0296547 A1* | 9/2019 | Kelly | H02J 3/004 |
| 2020/0142364 A1* | 5/2020 | Craig | G05B 13/04 |
| 2020/0342988 A1* | 10/2020 | Lymperopoulos | G16H 50/20 |
| 2020/0362674 A1* | 11/2020 | Alanazi | E21B 47/06 |
| 2021/0012054 A1* | 1/2021 | Adler | G06T 7/001 |
| 2021/0133631 A1* | 5/2021 | Prendki | G06F 16/2379 |
| 2021/0208545 A1* | 7/2021 | Zhang | G06N 5/04 |
| 2022/0164502 A1* | 5/2022 | Pei | G06N 20/00 |
| 2022/0179372 A1 | 6/2022 | Sahay et al. | |

FOREIGN PATENT DOCUMENTS

| | | |
|---|---|---|
| WO | 2018/009546 A1 | 1/2018 |
| WO | 2022120360 A1 | 6/2022 |

OTHER PUBLICATIONS

L. Xiao, Y. Miao and H. Su, "Production Tracking and Mass Balance in a Refinery Based on Manufacturing Operations Management and Data Reconciliation," 2009 First International Conference on Information Science and Engineering, 2009, pp. 2987-2990, doi: 10.1109/ICISE.2009.853. (Year: 2009).*
A. Khodabakhsh, I. Ari, M. Bakir and A. O. Ercan, "Multivariate Sensor Data Analysis for Oil Refineries and Multi-mode Identification of System Behavior in Real-time," in IEEE Access, vol. 6, pp. 64389-64405, 2018 (Year: 2018).*
Mouret, S. et al., "A Novel Priority-Slot Based Continuous-Time Formulation for Crude-Oil Scheduling Problems," Industrial & Engineering Chemistry Research, pp. 8515-8528 (Sep. 16, 2009).
Khor, C. S. and D. Varvarezos, "Petroleum refinery optimization," Optim. Eng., 18: 943-989 (2017).
International Search Report and Written Opinion for Int'l Application No. PCT/US2021/072698, titled: Method and System for Process Schedule Reconciliation Using Machine Learning and Algebraic Model Optimization, Dated: Mar. 2, 2022.
Final Office Action, U.S. Appl. No. 17/111,374, Date Mailed: May 9, 2022, titled "Method and System for Process Schedule Reconciliation Using Algebraic Model Optimization".
Non-Final Office Action for U.S. Appl. No. 17/111,374 titled: "Method and System for Process Schedule Reconciliation Using Algebraic Model Optimization," Date Mailed: Nov. 10, 2021.
Non-Final Office Action for U.S. Appl. No. 17/111,374 dated Sep. 12, 2022.
Final Office Action received for U.S. Appl. No. 17/111,374, mailed on Feb. 10, 2023, 23 pages.
Notice of Allowance received for U.S. Appl. No. 17/111,374, mailed on Jul. 14, 2023, 2 pages.
Notice of Allowance received for U.S. Appl. No. 17/111,374, mailed on Aug. 18, 2023, 2 pages.
Advisory Action received for U.S. Appl. No. 17/111,374, mailed on May 4, 2023, 3 pages.
Notice of Allowance and Fees Due (PTOL-85) Mailed on Jun. 29, 2023 for U.S. Appl. No. 17/111,374, 9 page(s).

* cited by examiner

| #DATE | 5/20/20 12:00 AM | | | | | |
|---|---|---|---|---|---|---|
| #HEADER | DESCRIPTION | PROPERTY | COMPOSITION | T-001 | T-002 | T-003 |
| | VOLUME/WEIGHT | VOL | | 70 | 90 | 85 |
| | API GRAVITY | API GRAVITY | | 25 | 24.5 | 24.7 |
| | SULFER, WT% | SULFER, WT% | | 1.0 | 1.3 | 1.2 |
| | AMENAM | COMP_VOL | AMENAM | 70 | | |
| | ETAME | COMP_VOL | ETAME | | 9.0 | |
| | RABI BLEND | COMP_VOL | RABI BLEND | | | 85 |
| #END | | | | | | |

FIG. 3

| CRUDE | 001 | 002 | 003 | 004 | 005 | 006 |
|---|---|---|---|---|---|---|
| C0C | 0.00% | 0.00% | 100.00% | 0.00% | 0.00% | 0.00% |
| C0D | 0.00% | 27.27% | 24.24% | 0.00% | 0.00% | 48.48% |
| C1U | 0.00% | 0.00% | 100.00% | 0.00% | 0.00% | 0.00% |
| C1V | 0.00% | 0.00% | 34.67% | 0.00% | 0.00% | 65.33% |
| C2O | 0.00% | 76.81% | 0.00% | 23.19% | 0.00% | 0.00% |
| C2V | 0.00% | 27.27% | 24.24% | 0.00% | 0.00% | 48.48% |
| C3I | 0.00% | 100.00% | 0.00% | 0.00% | 0.00% | 0.00% |
| C3J | 0.00% | 81.33% | 0.00% | 18.67% | 0.00% | 0.00% |
| C3W | 0.00% | 0.00% | 100.00% | 0.00% | 0.00% | 0.00% |
| C54 | 0.00% | 0.00% | 100.00% | 0.00% | 0.00% | 0.00% |
| C5C | 0.00% | 5.45% | 0.00% | 94.55% | 0.00% | 0.00% |
| C63 | 76.00% | 0.00% | 0.00% | 24.00% | 0.00% | 0.00% |
| C66 | 0.00% | 0.00% | 33.77% | 0.00% | 0.00% | 66.23% |
| C67 | 76.00% | 0.00% | 0.00% | 24.00% | 0.00% | 0.00% |
| C68 | 0.00% | 0.00% | 0.00% | 100.00% | 0.00% | 0.00% |
| C69 | 0.00% | 0.00% | 15.79% | 0.00% | 0.00% | 84.21% |
| C6A | 100.00% | 0.00% | 0.00% | 0.00% | 0.00% | 0.00% |
| C6B | 0.00% | 0.00% | 100.00% | 0.00% | 0.00% | 0.00% |
| C6F | 0.00% | 0.00% | 22.22% | 0.00% | 0.00% | 77.78% |
| C6H | 0.00% | 0.00% | 22.22% | 0.00% | 0.00% | 77.78% |

FIG. 6

| TANK | | ALERT | ATTRIBUTE | PLANT VALUE | SCHEDULE VALUE | BASELINE VALUE | NEW BASELINE TIME |
|---|---|---|---|---|---|---|---|
| ☐ ⁝⁝⁝ | T-101 🔧 | | VOL | 150.0 | 150.0 | 150.0 | 01/04/21 12:00 AM |
| ☐ ⁝⁝⁝ | T-102 🔧 | ① | VOL | 90.98 | 85.00 | 90.98 | 01/04/21 12:00 AM |
| ☐ ⁝⁝⁝ | T-103 🔧 | ① | VOL | 130.0 | 67.42 | 130.0 | 01/04/21 12:00 AM |
| ☐ ⁝⁝⁝ | T-104 🔧 | | VOL | 105.0 | 105.0 | 105.0 | 01/04/21 12:00 AM |
| ☐ ⁝⁝⁝ | T-201 🔧 | | VOL | 70.00 | 70.00 | 70.00 | 01/04/21 12:00 AM |
| ☐ ⁝⁝⁝ | T-202 🔧 | | VOL | 65.00 | 65.00 | 65.00 | 01/04/21 12:00 AM |
| ☐ ⁝⁝⁝ | T-203 🔧 | | VOL | 71.40 | 71.35 | 71.40 | 01/04/21 12:00 AM |
| ☐ ⁝⁝⁝ | T-301 🔧 | ① | VOL | 60.00 | 122.6 | 60.00 | 01/04/21 12:00 AM |
| ☐ ⁝⁝⁝ | T-302 🔧 | | VOL | 85.00 | 85.00 | 85.00 | 01/04/21 12:00 AM |
| ☐ ⁝⁝⁝ | T-303 🔧 | | VOL | 275.0 | 275.0 | 275.0 | 01/04/21 12:00 AM |
| ☐ ⁝⁝⁝ | T-304 🔧 | | VOL | 143.6 | 143.6 | 143.6 | 01/04/21 12:00 AM |

FIG. 10A

| TANK | | ALERT | ATTRIBUTE | PLANT VALUE | SCHEDULE VALUE | BASELINE VALUE | NEW BASELINE TIME |
|---|---|---|---|---|---|---|---|
| ☐ | T-101 ⋮⋮ | | VOL | 150.0 | 150.0 | 150.0 | 01/04/21 12:00 AM |
| ☐ | T-102 ⋮⋮ | | VOL | 90.98 | 90.98 | 90.98 | 01/04/21 12:00 AM |
| ☐ | T-103 ⋮⋮ | | VOL | 130.0 | 130.0 | 130.0 | 01/04/21 12:00 AM |
| ☐ | T-104 ⋮⋮ | | VOL | 105.0 | 105.0 | 105.0 | 01/04/21 12:00 AM |
| ☐ | T-201 ⋮⋮ | | VOL | 70.00 | 70.00 | 70.00 | 01/04/21 12:00 AM |
| ☐ | T-202 ⋮⋮ | | VOL | 65.00 | 65.00 | 65.00 | 01/04/21 12:00 AM |
| ☐ | T-203 ⋮⋮ | | VOL | 71.40 | 71.40 | 71.40 | 01/04/21 12:00 AM |
| ☐ | T-301 ⋮⋮ | | VOL | 60.00 | 60.00 | 60.00 | 01/04/21 12:00 AM |
| ☐ | T-302 ⋮⋮ | | VOL | 85.00 | 85.00 | 85.00 | 01/04/21 12:00 AM |
| ☐ | T-303 ⋮⋮ | | VOL | 275.0 | 275.0 | 275.0 | 01/04/21 12:00 AM |
| ☐ | T-304 ⋮⋮ | | VOL | 143.6 | 143.6 | 143.6 | 01/04/21 12:00 AM |

Event Details

Event Name: Marlim

*Last modified by CORP\sahayn on 07/22/20 6:09 AM*

Event Type: Receipt  #E7D687

Calculate ☐ Flexible Start/Stop

| | | | |
|---|---|---|---|
| Start | 01/03/21 12:00 PM | Prep: | 0 hrs |
| Stop | 01/04/21 4:00 AM | Post: | 0 hrs |
| Rate | 131.959 Mbbl/Day | | |
| Qnty | 65.979 Mbbl/Day | Max Volume | |

| General | Destinations |
|---|---|

Receive Via: Dock

Destination Strategy: Ullage Rotation

Destination ∧

🔍 Add destination tank...

| Type | Destination |
|---|---|
| Material Service | Sour Crudes |

Movements ∧

*optimized* ✎

| Tank | Start Time | Quantity | Rate |
|---|---|---|---|
| T-102 | 01/03/2021 12:0... | 65.98 | 132.0 |

FIG. 11B

METHOD AND SYSTEM FOR PROCESS SCHEDULE RECONCILIATION USING MACHINE LEARNING AND ALGEBRAIC MODEL OPTIMIZATION

RELATED APPLICATIONS

This application is related to co-pending U.S. patent application Ser. No. 17,111,374, entitled "Method and System for Process Schedule Reconciliation Using Algebraic Model Optimization," filed concurrently with the present application. The entire teachings of the above application are incorporated herein by reference.

BACKGROUND

Process scheduling is a fundamental decision-making step for the process industries (refining, petrochemical, chemical, etc.). Scheduling includes all decisions related to how the plant is to be operated on a day-to-day basis, and includes transfer of materials from external sources (e.g., tankers, vehicles, etc.) via pipelines into holding tanks, transfers among tanks, operating modes of the units, blending recipes for feeds and products. Schedulers must generate a feasible, practical schedule for the future time horizon in consideration. Once prepared, the schedules are passed on at an operational level for implementation.

SUMMARY

There are several techniques and methodologies that facilitate and improve the scheduling of refining and petrochemical processes. However, an important limitation is that they do not formally address the reconciliation step that precedes any scheduling activity and that is a necessary precondition for the application of those techniques. While it would be ideal to carry out the schedule accurately, that is often not possible due to various factors like disturbances in flowrates, stream qualities, unexpected delays in feedstock arrival and product shipment times. Since the operational activities usually do not exactly match what was prescribed in the schedule, schedulers must also reconcile what was prescribed in the past schedule with the actual operations. This step is important as it informs the scheduler of the current state of the refinery as well as the current ongoing operations. Both are critical pieces of information that are required for the scheduler to determine a future schedule. In fact, refinery schedulers typically start their day by reconciling and spend a significant amount of time on the activity.

Current plant data measured by sensors and a detailed list of activities obtained from the operations team are used as the basis for reconciliation. Often, it is required that the raw plant data from the different sensors first be aligned to handle inconsistencies. There are a few clear challenges faced by the schedulers in carrying out this fundamental activity. First, the plant data are mostly noisy and therefore the exact values are unknown. Second, the entire reconciliation process is manual. Schedulers need to adjust the schedules in a step-by-step fashion, evaluating the simulated values against the plant data at every step, resulting in an iterative process often achieved by trial-and-error. Finally, this is an activity they need to do (almost) every day before they can begin to schedule for the future, arguably the most productive part of their job. It requires substantial effort and can consume a significant fraction of their overall working time.

This invention provides a novel solution that automatically reconciles schedules for a specific refinery based on measured plant data and given historical schedule decisions with minimal or no human intervention. In this process, this invention utilizes a combination of machine learning (ML) algorithms, statistical approaches, and rigorous mathematical optimization algorithms to establish the actual operational activities carried during a reconciliation horizon and automatically adjust the schedule.

In embodiments consistent with principles of the invention, a computer-implemented system for process schedule reconciliation receives a scheduling model and an initial schedule for reconciliation, where the initial schedule includes projected plant data. Current plant data is imported into the system, and dynamic optimization data representing trends in process data at time-varied values for key process and operation parameters are identified. The current plant data and projected plant data are processed using mathematical modeling techniques to identify event boundaries, stream flowrates associated with tanks and process units. The system builds an optimization model applying identified event boundaries, stream flowrates, dynamic optimization data and pre-determined constraints along a period of time that includes priority slots to reconcile the projected plant data of the initial schedule with the current plant data, and then solves the optimization model to develop a reconciled schedule.

In other embodiments consistent with principles of the invention, a computer-implemented system for process schedule reconciliation receives a scheduling model and an initial schedule for reconciliation, where the initial schedule includes projected plant data. Current plant data is imported into the system. The current plant data and projected plant data are processed using mathematical modeling techniques to identify event boundaries, stream flowrates associated with tanks and process units. Historical scheduling data is imported, the historical scheduling data having historical reconciled schedules and their corresponding initial state data and projected state data, the historical scheduling data. The system processes the historical scheduling data to develop machine learning and statistical models to identify key scheduling parameters. The system builds an optimization model applying identified event boundaries, stream flowrates, key scheduling parameters and pre-determined constraints along a period of time that includes priority slots to reconcile the projected plant data of the initial schedule with the current plant data, and then solves the optimization model to develop a reconciled schedule.

The pre-determined constraints may include operation constraints and scheduling constraints. Additionally, they may be applied across multiple periods, wherein reconciling the projected plant data includes determining the timing of the priority slots within period boundaries. In some embodiments, the dynamic optimization data is based on reconciliation data obtained at some set frequency, such as once every few minutes. In yet other embodiments, the scheduling model and optimization model include different types of resources, including transportation modes, tanks, mixers, splitters and production units, that represent the corresponding resources in the refinery scheduling operations system.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments, as illustrated in the accompanying drawings in which like reference characters refer to the same parts throughout the different views. The drawings are not necessarily to scale, emphasis instead being placed upon illustrating embodiments.

FIG. 3 is a chart showing sample plant data for import into the workflow consistent with principles of the invention.

FIG. 6 is a chart showing the mapping of different crudes in an embodiment consistent with principles of the invention.

FIG. 10A is a table showing the imported plant values and projected values based on an initial schedule.

FIG. 10B is a table showing the imported plant values and the projected values based on a reconciled schedule.

FIGS. 11A and 11B are example user interfaces illustrating event details in an initial schedule, and a reconciled schedule respectively.

DETAILED DESCRIPTION

A description of example embodiments follows.

Embodiments consistent with principles of the invention are directed at a new method for schedule reconciliation in the process industry. These embodiments provide a unique and novel way to reconcile past schedules automatically based on specific details about the schedule and the measured plant data for a given reconciliation horizon, as well as historical scheduling patterns and user actions related to reconciliation activities in the past. The invention can be compared to any methodology or tool schedulers use for reconciling their schedules. However, there is no specific tool or published methodology that is explicitly used for reconciliation purposes. In the industry, reconciliation calculations are mostly done manually by schedulers on a trial-and-error basis. These reconciliation activities include (but are not limited to) reconciling the specific attributes (such as start and stop time, rate, etc.) of past events (such as receipts, transfers and shipments) with present information (such as inventory positions, unit operations, etc.). These activities are required in order to establish a realistic and accurate starting point for scheduling all future plant activities. Although schedulers can use experience to identify likely adjustments, significant manual effort is required in this iterative process. Embodiments consistent with principles of the invention is unique as it provides a comprehensive tool that builds a rigorous optimization model especially tailored towards the schedule reconciliation problem and guides its solution towards better results by combining process modeling and optimization principles with historical precedence that aims to capture the schedulers' experience gained over time.

Using historical schedules and past user actions corresponding to reconciliation, machine learning (ML) and statistical models are trained to learn what type of schedules can be considered standard as well as predict actions the scheduler would take to reconcile any schedule. These learnings gained by the models can be applied to improve the optimization model by reducing the feasible space or adjusting the objective function to drive towards a more practical, reliable solution.

Additionally, the tool includes a component that processes the noisy tank inventory data obtained from the historian to transform it into piece-wise linear trends. The trends are then utilized by the tool to infer details about the operational activities and improve the optimization model.

Figure 1:
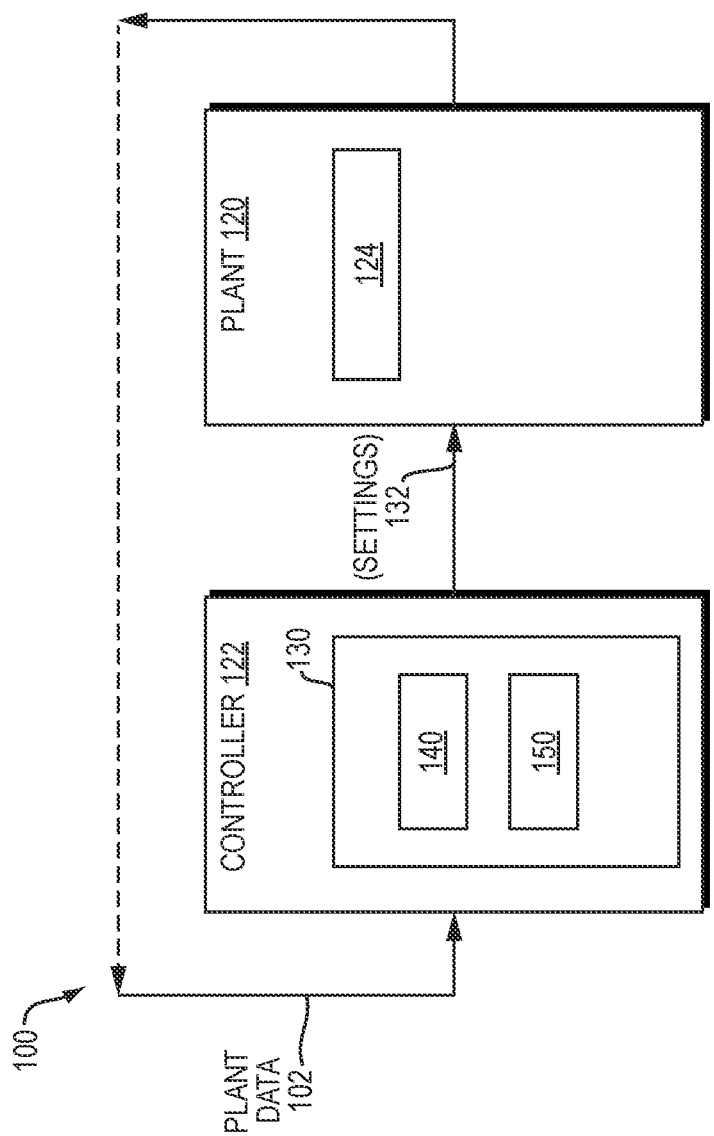
FIG. 1 is a block diagram of a process control method and system embodying the present invention.

FIG. 1 illustrates a process control (or more generally a process modeling and simulation) method and system 100 in which principles of the present invention may be incorporated. Briefly, an industrial plant (chemical processing plant, refinery, or the like) 120 performs chemical processes of interest 124. Non-limiting examples include pharmaceuticals production, petroleum refining, polymer processing, and so on. Plant equipment includes distillation columns, various kinds of reactors and reactor tanks, evaporators, pipe systems, valves, heaters, etc. by way of illustration and not limitation. Plant data 102 represents inputs (feed amounts, values of certain variables, etc.) and outputs (products, residuals, physical operating characteristics/conditions, etc.) of the chemical process 124. A controller 122 employs model process control to configure and maintain settings 132 (i.e., parameter values, temperature selection, pressure settings, flow rate, other values of variables representing physical characteristics) operating the plant equipment in carrying out the subject chemical process 124.

The model process control is based on models (of the subject chemical process) generated by process modeling system 130. In embodiments of the present invention, the process modeling system 130 employs a reconciliation module 140 to reconcile past schedules with the plant data 102. Using the reconciliation data for modeling optimization 150, the process modeling system generates a reconciled process schedule to set setting 132 for deployment in the plant 120.

This invention has multiple modules for model building and solution, each consisting of a different data management, machine learning or optimization technology. Together, these modules form a decision-making support framework that is used to reconcile the schedules.

Figure 2A:
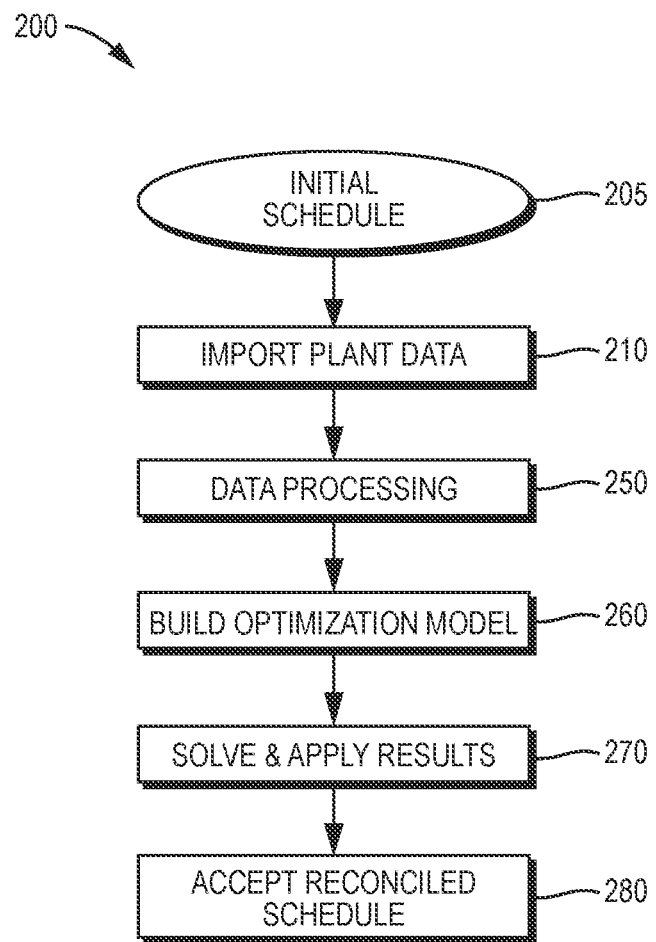
FIG. 2A is a flow diagram showing workflow for an automatic process schedule reconciliation that may be used in an embodiment consistent with principles of the invention.
Figure 2B:
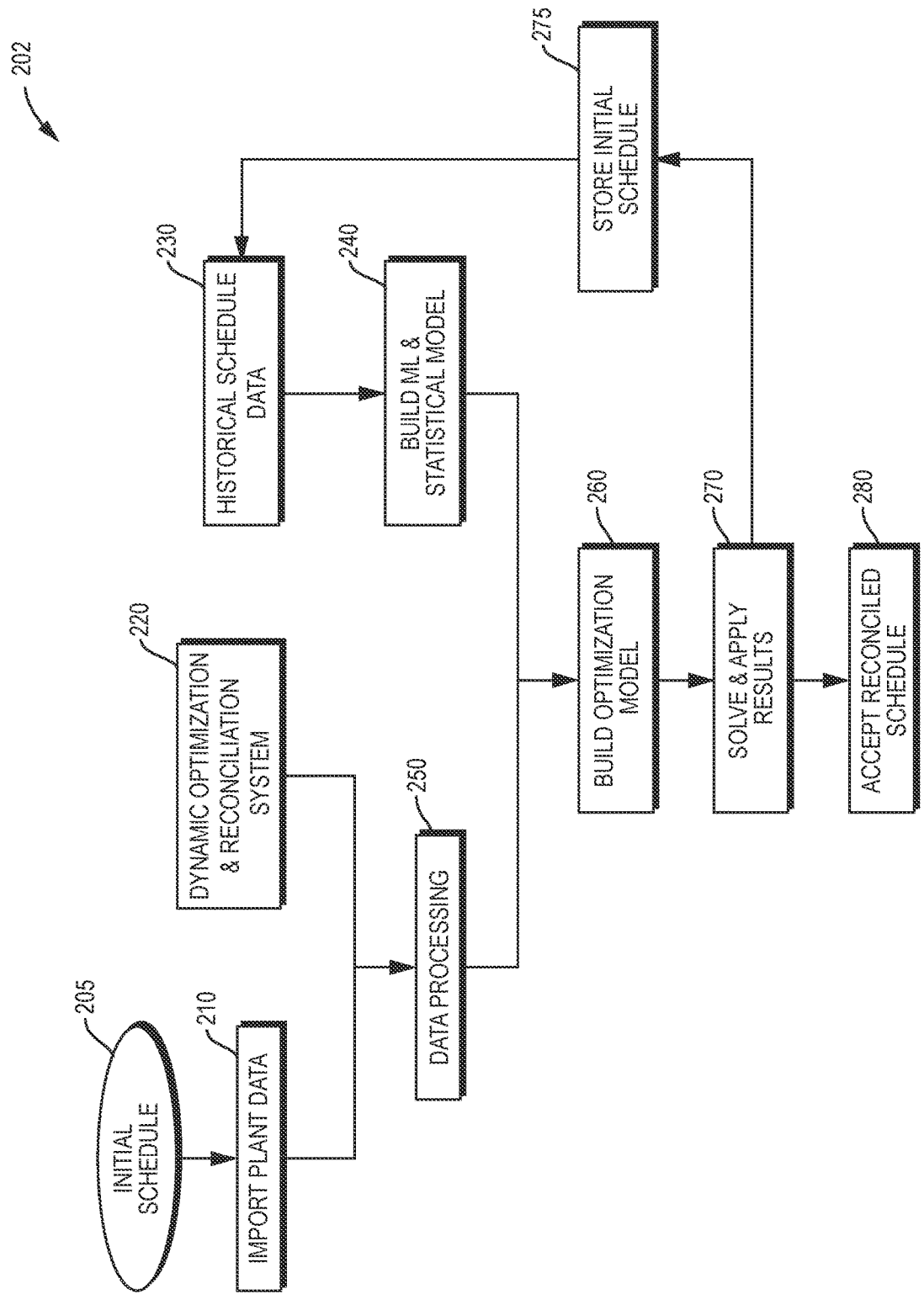
FIG. 2B is a flow diagram showing an alternative workflow for an automatic process schedule reconciliation that may be used in another embodiment consistent with principles of the invention.

FIG. 2A shows the overall workflow 200 for an embodiment of a reconciliation module 140 of FIG. 1 consistent with principles of the invention. The starting point of the reconciliation algorithm is an existing initial scheduling model 205 in a refinery scheduling software, such as Aspen™ Petroleum Scheduler (APS). FIG. 2B shows an alternative workflow 202 for another embodiment of a reconciliation module 140 consistent with principles of the invention. The workflow 202 includes the general workflow 200 of FIG. 2A, but further includes modules that use dynamic optimization and historical scheduling data.

Starting with an initial scheduling model 205 that needs to be reconciled, the user imports actual current plant data to reconcile against at the Import Plant Data Module 210. The user configures the current plant data to import and can choose to read tank inventory levels, compositions, properties, and stream flowrates. In some embodiments consistent with principles of the invention, the current plant data may be imported either from an Excel file or from a process data historian. While an Excel file may provide data for a discrete set of time stamps, connecting to a historian allows importing data stored in the historian for the given reconciliation time window. FIG. 3 shows sample plant data that can be imported through an Excel file 300. Here the first row contains the baseline time for which the plant data is being provided. The figure contains inventory volume, API gravity, sulfur and material composition (i.e. Amenam, Etame, and Rabi Blend by composition volume) data for three tanks named T-001, T-002 and T-003.

In some other embodiments as shown in FIG. 2B, an overall workflow 202 may include a Real-time Optimization Data Processing Module 220 addresses the need to infer what happened in the recent few hours of operations by using continuous values for key process parameters that vary over time. This time variation can be due to input variability (feed composition and properties for a unit) or can be the results of a continuous degradation of process characteristics over time (such as catalyst deactivation, loss of tray efficiency in distillation, or fouling in heat exchanging). This is important information that cannot come from direct plant observations (measurements) but can be inferred from a dynamic process model that performs reconciliation at a very high frequency (every few minutes). A commercial example of such dynamic optimization and reconciliation system is the Aspen™ GDOT and specifically its Data Reconciliation function.

The Real-time Optimization Data Processing Module 220 operates under the notion that trends in process production and efficiency data can provide significant insights about the actual values of large subsets of process input and output variables (such as flows or properties) that are not or that cannot be directly measured in real-time (or at a frequency that enables confident scheduling decisions). This inference provides important meta-data information that in conjunction with the plant measurements and the underlying mathematical model can remove or minimize any uncertainty on the initial state of the process. This additional information ensures a robust reconciliation system that ultimately provides the starting point for the scheduling process. It should be noted here that without an accurate starting point for all process variables at any given point in time, making scheduling decisions for future events can be problematic.

The Reconciliation Window Plant Data Processing Module 250 addresses the need to infer what happened in the recent few hours of operations by using event and inventory information from the reconciliation window. The input to the Reconciliation Window Plant Data Processing Module 250 is obtained from Import Plant Data Module 210 and contains tank inventory values at multiple time points while the output contains a set of time points and the effective rate of change in inventory between them for each tank. Typically, the length of the reconciliation window is a few hours, but it can go up to a few days (during weekends for example). Generally, trends in tank inventory data can provide significant insights about flows into or out of tanks. The rate of change in tank inventory values can reveal the effective flowrates into or out of the tank. Additionally, the time points where those rates change indicate the start or stop times of events associated with the tank. The module uses a statistical approach to fit a piece-wise linear trend to the noisy tank inventory data. The linear segments identified by a reconciliation window plant data processing algorithm denote the event durations on the tank. The approach is also able to identify outliers and removes them from analysis. Based on the source of imported data, the data processing module may or may not be triggered. If the imported data comes from a historian, Reconciliation Window Plant Data Processing Module 250 is used to process the tank inventory values.

Figure 4:
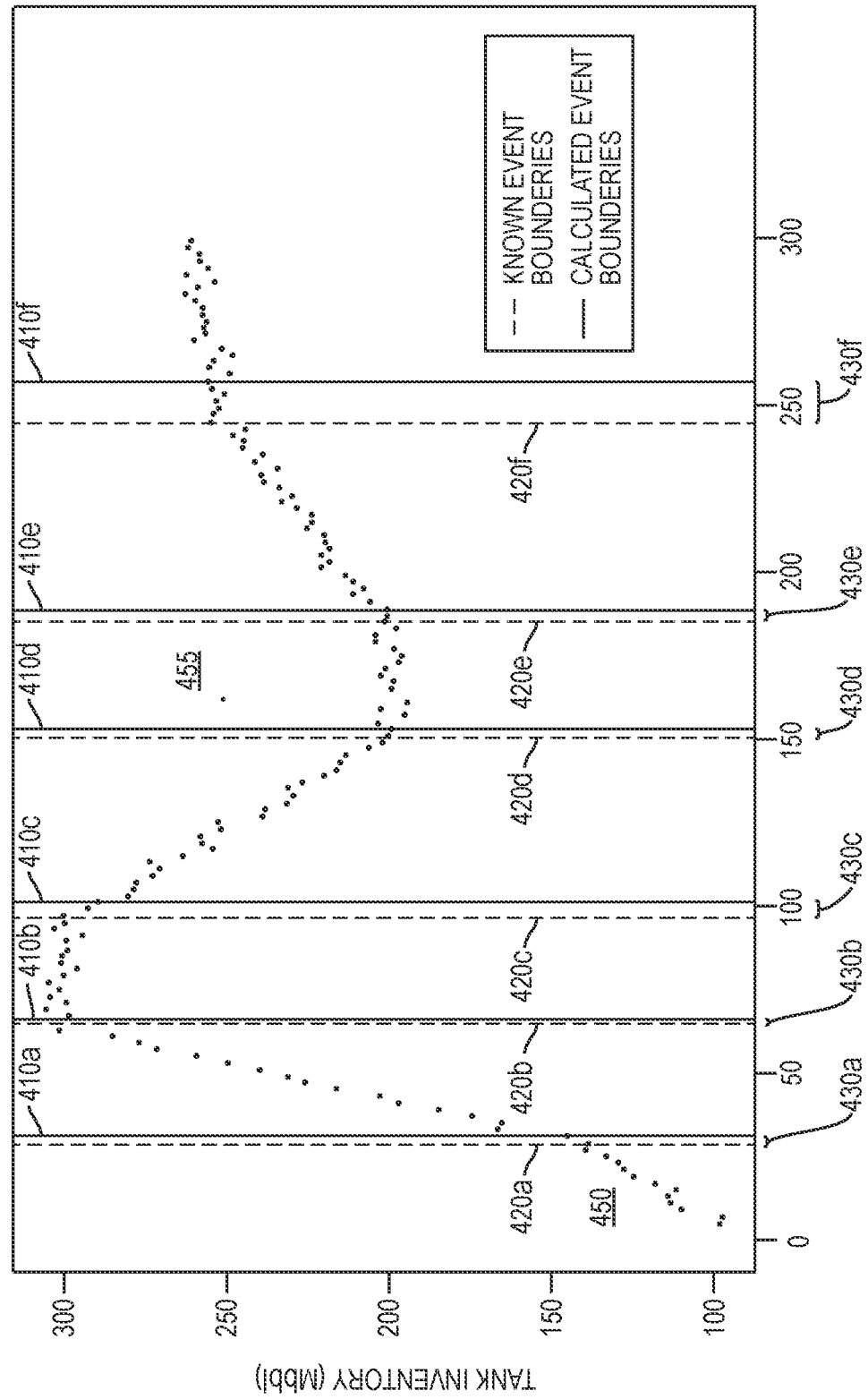
FIG. 4 is a graph illustrating how a data processing module used in FIGS. 2A and 2B works on noisy plant data to calculate boundaries of events on a tank.

The application of the module on a sample dataset is shown in FIG. 4. The start and stop times of the events, and the stream flowrates into or out of the tanks inferred in this module are used as inputs to the module that builds the optimization model. These details help the optimizer find a solution that is closer to where the baseline values arrived.

In some embodiments, such as shown in FIG. 2B, a Historical Schedule Data Management Module 230 maintains a record of past scheduling data for the models. Three types of data are stored by this module, namely initial state, projected state and reconciled schedule. As the data stored is specific to the reconciliation workflow, the data can be identified into sets where each set corresponds to a time window that was reconciled. Initial state data contains simulated inventory quantities for all tanks at the beginning of the reconciliation window and events data for the reconciliation window. Events data includes start times, durations, stream flowrates, and parameters like composition, tank fractions etc. based on the type of the event. Projected state data contains the projected plant values for tank inventory quantities, qualities and composition values at the specific baseline times.

Every time the schedule is reconciled, the system saves the versions before and after reconciliation. This ensures that as the scheduler reconciles the schedule and rolls forward, the system maintaining a record of the initial and final states and reconciled schedules. These initial states of the schedule along with the plant data form the input while the corresponding reconciled schedule form the output training data for the ML models described below in connection with the Machine Learning and Statistical Models Module 240.

The Machine Learning and Statistical Models Module 240 processes historical scheduling information to create machine learning (ML) and statistical models, as well as derive statistical insights. The outputs from this module help improve the optimization model by reducing the combinatorically explosive options available (model feasible space) and driving the optimizer towards a solution that better captures the desirable operational activities based on best practices in the past. Statistical results from historical scheduling data provide guidance on key scheduling parameters for the optimizer which are not necessarily specified in the scheduling model.

Machine learning provides a powerful mechanism to incorporate data into process models. Machine learning algorithms are typically easy to automate and can continuously improve as more data becomes available. In addition, these algorithms are good at handling multi-dimensional data and datasets containing different data types. Machine learning models are used to predict the changes needed to reconcile the schedule based on its current state and the projected state. In order to build these ML models, versions of historical scheduling data in the Historical Schedule Data Management module 230 are used. These ML models predict the user actions needed to reconcile the schedule based on given state of the schedule and baseline data.

Training data for these ML models would include tank inventory and property values at the beginning of the reconciliation window as well as reconciliation window initial events details as the independent variables. Data related to events modified for reconciliation would be used as dependent variables. Event details would include the rate, quantity, start, and other relevant parameters.

In the Build Optimization Model Module 260, a mathematical programming model for the refinery schedule reconciliation problem is developed to ensure that all decisions satisfy the fundamental physical conservations laws (mass, energy, and momentum conservation) as well as the mechanical and engineering constraints of the process for which we need to provide a schedule. The model consists of different types of resources, namely transportation modes, tanks, mixers, splitters and production units, that represent the corresponding resources in the refinery scheduling operations system. Transportation modes are non-inventory resources used for receiving or shipping materials like crude oils and blends. Tanks are the inventory resources where materials are stored. Mixers and splitters are non-inventory resources used for mixing multiple streams into one and splitting a stream into many respectively. Production units are the process units that take input feed streams and produce one or more output product streams. Taking all the resources and their connectivity into account, the set of operations is determined by considering all possible discrete selections of actions in the system and the schedule is represented as a sequence of these operations. The goal is to determine the sequence of operations, i.e. when the operations are performed (time and duration), how many times they are performed, and the flow between resources so as to come up with a reconciled schedule that is aligned with the actual operational activities and leads to the baseline values.

The formulation uses a hybrid discrete-continuous time representation. A non-uniform discrete time period grid based on the initial schedule is used such that the start and end times of all the original events constitute the period boundaries. A pre-determined number of continuous time priority slots are introduced within the periods and are used to assign and sequence the execution of operations. A priority slot denotes a position in the sequence of operations. So, a priority slot with a higher index has a higher priority for scheduling compared to one with a lower index. Continuous time priority slots are required as the start and stop time of operations are unknown and need not correspond to the pre-existing period boundaries. Multiple operations can be assigned to a priority slot. However, the start and stop times of the slots are synchronized. The synchronization is necessary in order to accurately apply cardinality constraints.

The constraints used in the formulation can be divided into two main classes, scheduling constraints and operation constraints. Scheduling constraints model logistics rules and include non-overlapping constraints, cardinality constraints and continuous operation of units. Operation constraints include material balances, flowrate bounds based on pumping capacities and tank capacities. These constraints are applied on priority slots within each period as well as across periods. Additional constraints are used to align the flows at the period level with those at the priority slot level. Following is a description of the equations that may be used in the Build Optimization Model Module 260.

Nomenclature
Sets
  S slots
  W operations
  P periods
  T tanks
  $S_p$ slots in period p
  $W_{In,t}$ inlet operations on tank t
  $W_{Out,t}$ outlet operations on tank t
Indices
  s slot
  operation
  t tank
  p period
Variables
  $Z_{s,v}$ assignment of operation v to slot s
  $F_{s,v}$ flow associated with operation v in slot s
  $Stt_{s,v}$ start time of operation v in slot s
  $End_{s,v}$ end time of operation v in slot s
  $Dur_{s,v}$ duration of operation v in slot s
  $FR_v$ flowrate of operation v (only for receipts and shipments)
  $Inv_{t,s}$ inventory in tank t at slot s
  $Inv_{t,p}$ inventory in tank t at period p
Parameters
  H schedule reconciliation horizon
  $\underline{FR}_v$ minimum flowrate of operation v
  $\overline{FR}_v$ maximum flowrate of operation v
Non-Overlapping Constraints:

$$z_{s,v1} + Z_{s,v2} \leq 1, v1, v2 \in W, NO_{v1,v2} = 1 \quad (1)$$

Equation 1 states that if operations v1 and v2, belonging to the set of all operations W, do not overlap ($NO_{v1,v2}=1$), the operations cannot be simultaneously assigned to slot s. Here $z_{s,v1}$ and $Z_{s,v2}$ are binary assignment variables that determine whether operation v1 and v2 are assigned to slot s or not respectively.

Cardinality Constraints:

$$\Sigma_{v \in W'} z_{s,v} \leq \overline{N_{W'}} \quad (2)$$

$$\Sigma_{v \in W'} z_{s,v} \geq \underline{N_{W'}} z_{s,v1}, v1 \in W' \quad (3)$$

Equations 2 and 3 represent cardinality constraints on subsets of operations. Equation 2 states that the sum of assignment variables of the subset of operations for a slot is less than the maximum number of operations ($\overline{N_{W'}}$) that can happen simultaneously from within the subset W'. Equation 3 states that if any of the operations within the subset W' is assigned to a slot, a minimum number of operations ($\underline{N_{W'}}$) must be assigned.

Continuous Operation:

$$\Sigma_s Dur_{s,v} = H \quad (4)$$

Equation 4 states that the sum of the durations of all priority slots for an operation v equals the length of the reconciliation horizon. This constraint is applied for operations that are required to be performed continuously.

Timing Constraints:

$$0 \leq Stt_{s,v} \leq Z_{s,v} \overline{Stt_{s,v}} \quad (5)$$

$$0 \leq End_{s,v} \leq Z_{s,v} \overline{End_{s,v}} \quad (6)$$

$$0 \leq Dur_{s,v} \leq Z_{s,v} \overline{Dur_{s,v}} \quad (7)$$

$$End_{s,v} = Stt_{s,v} + Dur_{s,v} \quad (8)$$

The timing constraints define the relationship between start time, end time and duration of slots for and operation v within periods. The upper bounds on these variables equal the length of the period corresponding to the slots.

Flowrate Constraints:

$$\underline{FR}_v \cdot Dur_{s,v} \leq F_{s,v} \leq \overline{FR}_v \cdot Dur_{s,v} \quad (9)$$

Equation 9 enforces the bounds on flow values $F_{s,v}$ based on the flowrate limits for operation specified in the model.

$$F_{s,v} = FR_v \cdot Dur_{s,v} \quad (10)$$

Equation 10 is added only for the subset of operations corresponding to receipts and shipments. It used to enforce a uniform flowrate for the duration of the event. Here $FR_v$ represents the reconciled flowrate of the receipt or shipment event.

Material Balance:

$$Inv_{t,s} = Inv_{t,s-1} + \Sigma_{v \in W_{In}} F_{s,v} - \Sigma_{v \in W_{Out}} F_{s,v} \quad (11)$$

$$Inv_{t,p} = Inv_{t,p-1} \Sigma_{v \in W_{In}} F_{p,v} - \Sigma_{v \in W_{out}} F_{p,v} \quad (12)$$

$$\Sigma_{s \in S_p} F_{s,v} = F_{p,v} \quad (13)$$

Equations 11 and 12 enforce total material balances at the slot and period levels respectively. Inventory level of any tank t at a slot or period is equated to the level in the previous period plus flows due to inlet operations on the tank during the slot or period minus flows due to outlet operations in the slot or period. In order to align the two material balances, sum of flows in slots for a period is equated to the flow in the period using equation 13. Similar balances for each material are enforced to obtain composition balances.

Based on the results obtained from the Reconciliation Window Plant Data Processing Module 250 and the Machine Learning and Statistical Models Module 240, additional constraints may be introduced. The additional hard constraints reduce the feasible space for the problem while soft constraints allow adding terms to the objective function so as to drive the solution.

All the variables of the model are initialized based on a simulation of the original schedule. As mentioned earlier, the period grid is obtained from the start and stop times of the events in the initial schedule. For each period, the first slot is assigned during initialization. The remaining slots are left unassigned.

The presence of bilinear terms in the composition balances and the uniform flowrate constraints leads to a mixed integer nonlinear programming (MINLP) formulation. This is solved using a nonlinear optimization solver, such as the AspenTech's proprietary Aspen XSLP.

The objective is to minimize a weighted sum of multiple types of penalties. Some of these penalties are specifically useful because there can be multiple solutions available that achieve the same baseline values. Penalties are applied on deviation from the following.

Baseline values: Baseline values are the projected plant data values obtained from plant data. Since the objective of this workflow is to match the baseline values, any difference between the schedule values and the baseline values is penalized. This is the main driver for the optimization.

Initial schedule: Deviation from initial schedule (or original schedule) is penalized as it is favorable for the reconciled schedule to not be too different from the initial schedule. The initial schedule serves as the instructions to be carried out for operations. Actual operations deviate from a schedule only if necessary.

Data processing results: If the data processing step is used, differences between schedule values and those obtained from the data processing step are penalized.

Statistical and ML insights: These are based on careful analysis of historical scheduling data for the refinery and reflect how operations have been carried out in the past.

The result of this module is a Solution file that contains all the variables of the optimization model with their optimal values.

The Reconcile Schedule Module 270 module manages updating the schedule as well as maintaining a record of the schedule prior to the update. Storing a snapshot of the original version is necessary so that the information can be utilized in the future, specifically for building machine learning and statistical models.

The module reads the solution file obtained from the previous module and applies the results to update the schedule. It contains logic to translate the variable names to the different parameters of the events. Accordingly, it updates existing events with adjusted start time, stop time and flowrate. The logic also creates new tank-to-tank transfers if needed. Receipts, shipments or crude runs are not created or deleted. However, a receipt or shipment event may be moved out of the reconciliation window. In case the original event has to be moved such that it occurs only partially within the reconciliation window, it is moved to the desired time and split at the reconciliation window end time. As mentioned above with respect to the Historical Schedule Data Management Module 230, after the schedule is reconciled, the reconciled schedule and the initial schedule are stored 275 when the user accepts the changes 280.

Data Processing

Using example data, FIG. 4 illustrates how a data processing module 250 of FIGS. 2A and 2B works on noisy plant data to calculate boundaries of events on a tank. A given schedule of events on a tank was used for this illustrative case study and noisy synthetic tank inventory data corresponding to the schedule was used. The x-axis shows the time in minutes while the y-axis shows the tank inventory in thousands of barrels (Mbbls). The dots 450 in the figure represent the noisy plant data for tank inventory values. The solid lines 410a-f represent the event boundaries calculated by the reconciliation window plant data processing algorithm while the dashed lines 420a-f are the known event boundaries based on the given schedule. The calculated event boundaries 410a-f obtained from the algorithm are close to the original 420a-f. Additionally, the algorithm automatically ignores the one outlier 455 that was introduced in the dataset. The results from this step provide a good estimate of the net flowrate into or out of the tank in each time interval. In some instances, the deviation (shown as 430a-f) between the calculated event boundary and the known event boundary is virtually non-existent (430b representing the deviation between 410b and 420b). In other instances, the deviation is relatively pronounced (430f representing the deviation between 410f and 420f). A penalty against deviation from the net flowrate is added to the optimization model for the respective time intervals. It is to be noted that the event boundaries and net flowrates calculated using the algorithm are not used as hard constraints in the optimization model.

Receipts Analysis

Figure 5:
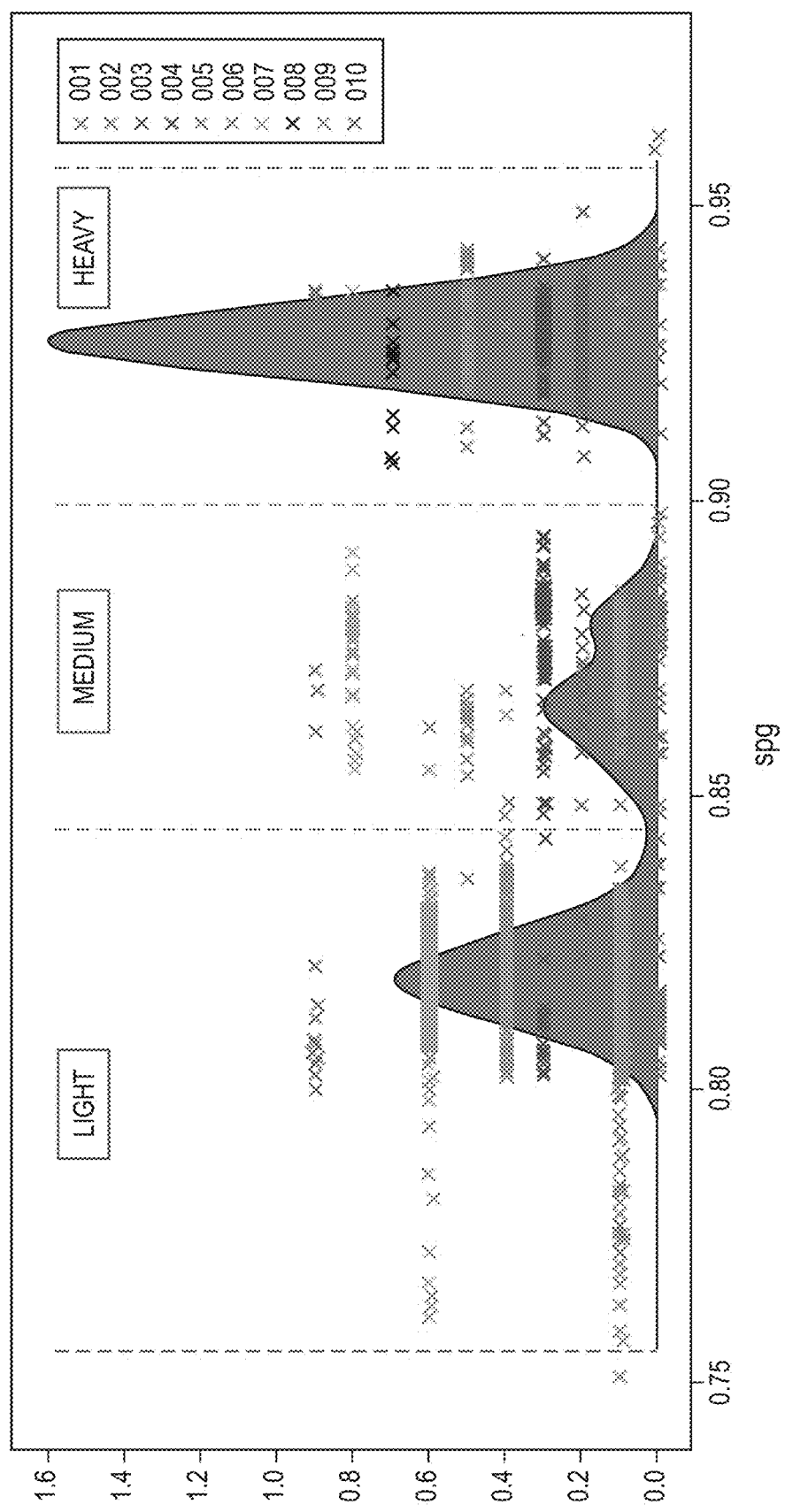
FIG. 5 is a graph showing the analysis of receipt events and displays in an embodiment consistent with principles of the invention.

FIG. 5 shows the analysis of receipt events and displays how they are clustered into separate regions of specific gravity, namely light, medium and heavy, using kernel density estimates, and how the destination tanks are assigned into those different clusters. The x-axis represents the specific gravity of the receipt and the y-axis represents the kernel density estimate. The colored crosses represent the different tanks as shown in the legend. A different clustering technique can be applied to consider multiple properties as well. This analysis provides information about the most likely destination tanks based on the composition of a crude receipt. This is an example of an unsupervised ML technique that is used to understand the receipt events better and subsequently help of the optimizer choose the right destination tanks.

FIG. 6 shows a mapping of the different crudes in the model, identified by the row headers, with the tanks, identified by the column headers. The values in a row represent the percentage of crude receipt events containing the row crude that are sent to the respective column tank. As shown in the figure, the mapping reveals a very distinct tank assignment for most of the crudes, with some crudes, highlighted in green, being assigned to a single tank. While the previous approach uses the bulk properties of crude receipts to determine tank assignments, this provides a more direct approach. The clustering approach using bulk properties complements this technique and becomes particularly useful when crude-to-tank mapping does not reveal definitive tank assignments.

Crude Runs Analysis

Figure 7:
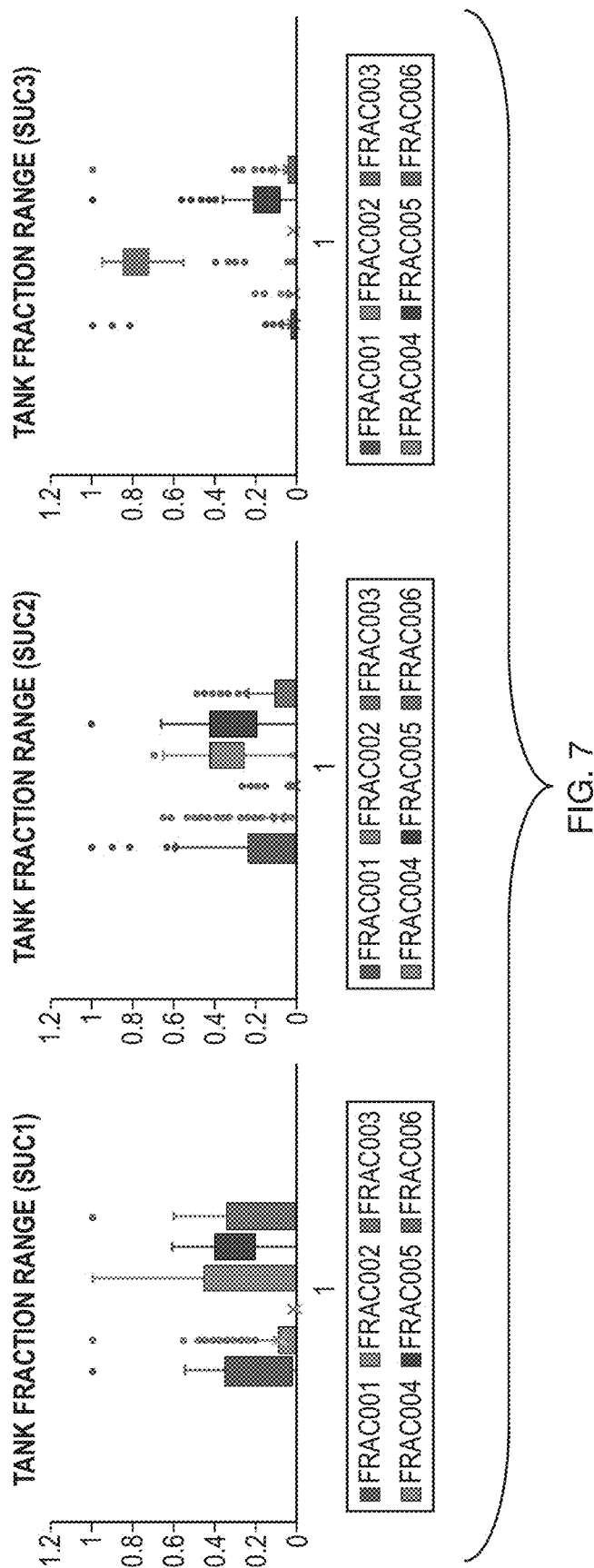
FIG. 7 is a diagram illustrating the different ranges of tank fractions used in crude runs events in past schedules.

FIG. 7 shows the different ranges of tank fractions used in the crude run events in the past schedules. The 3 plots show the fractions corresponding to events for 3 different crude units in the model. The plot for SUC3 provides a very clear indication regarding the use of tanks for the specific crude unit. For instance, Tank T-003 (fraction range represented by Frac003) is the predominant tank used for feeding the tower while Tank T-004 (fraction range represented by Frac004) is never used. Similarly, Tank T-003 is never used for SUC1 while very rarely used for SUC2 in small fractions. These insights regarding limits on tank fractions for crude runs are translated into soft constraints for the optimization problem.

Figure 8:
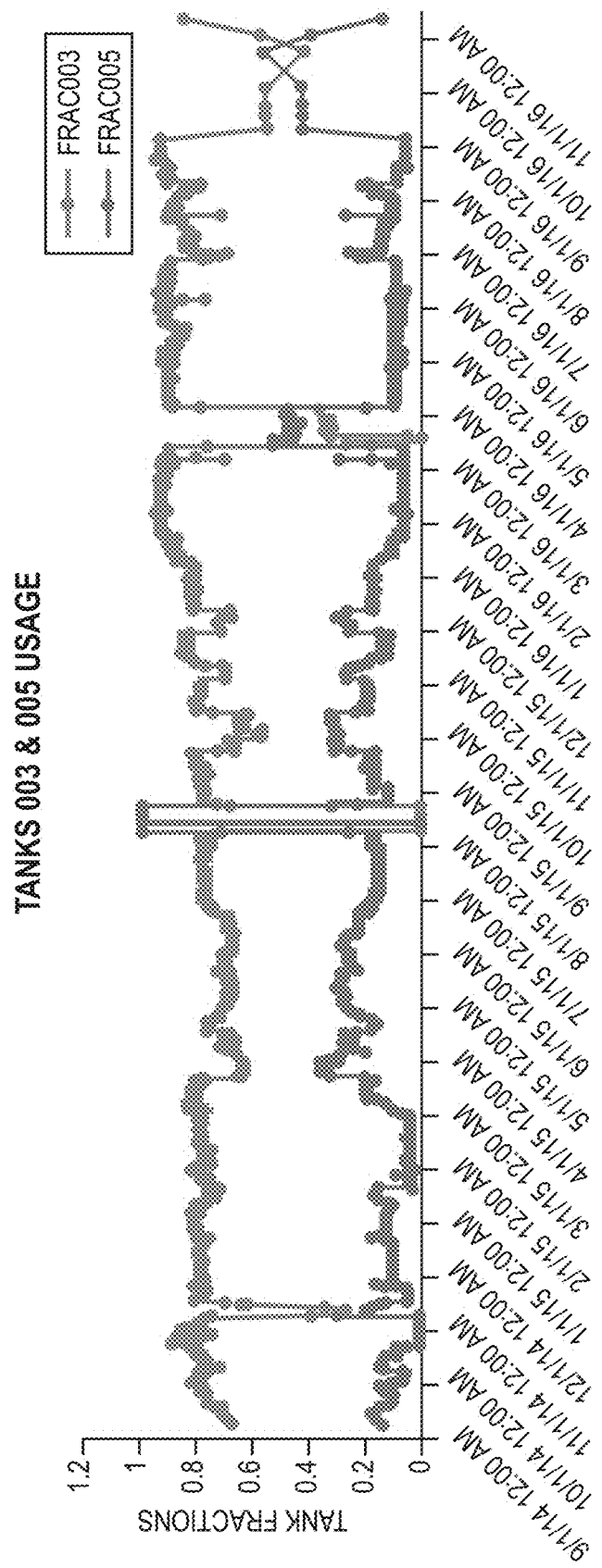
FIG. 8 is a graph illustrating the tank association analysis in crude runs over time.

On carrying out association rule mining on tank fractions data for the crude runs associated with the distillation tower SUC3, the combination of Tank T-003 and Tank T-005 has lift greater than 1 and support values close to 1. Lift greater than 1 indicates that the two tank fractions are substitutes of each other, as observed in FIG. 8, which illustrates tank association analysis in crude runs over time. Such insights derived from association rule mining provide additional information about how the schedules have been generated in the past and are translated into soft constraints for the optimization problem.

Reconcile Schedule

Figure 9A:
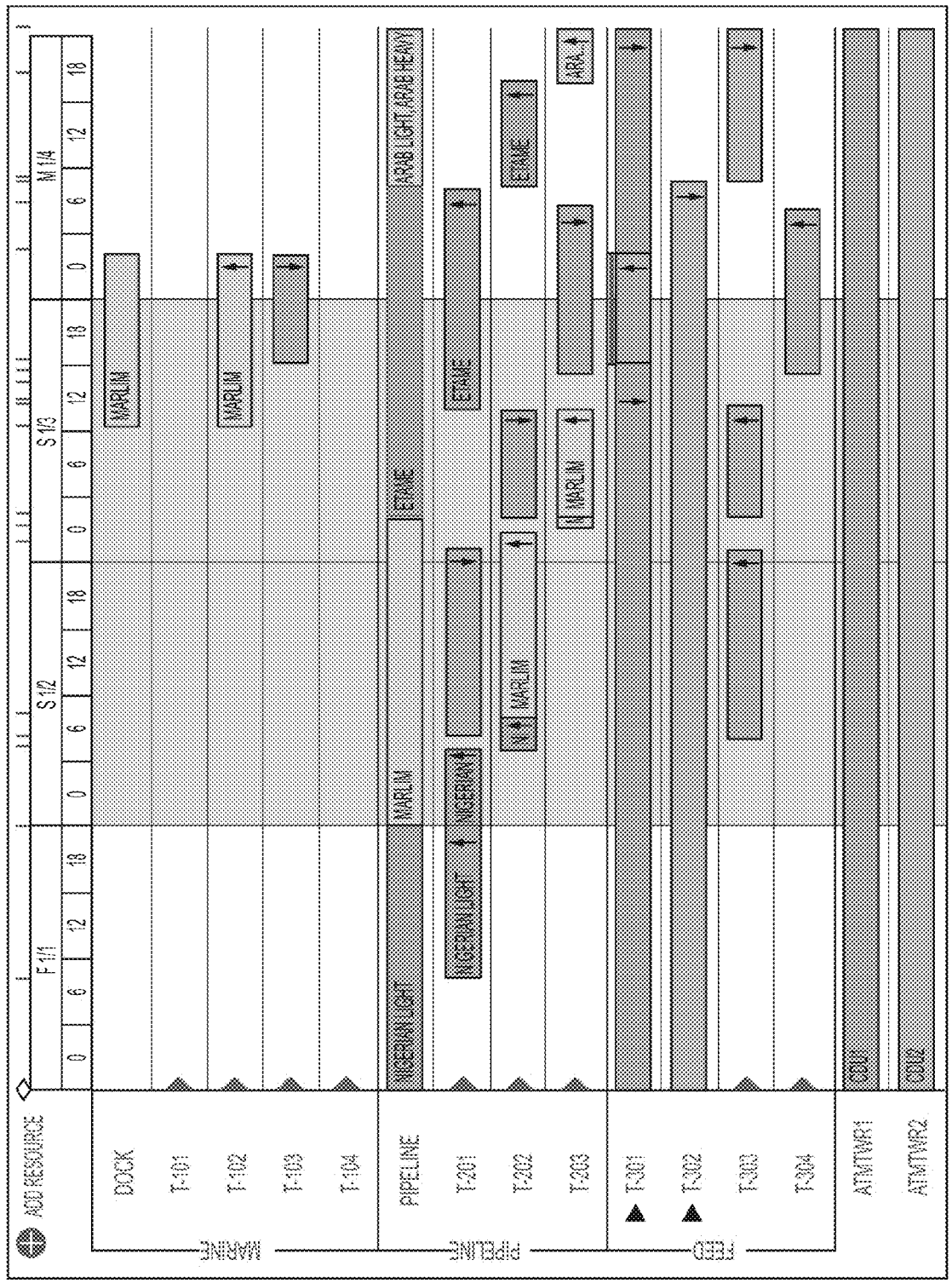
FIGS. 9A and 9B are Gantt charts representing an initial scheduling model and a reconciled schedule.

FIG. 9A shows the Gantt chart for a sample initial schedule. This represents the crude scheduling part of the refinery and has 4 tanks (T-101 to T-104) that receive crudes through a dock, 3 tanks (T-201 to T-203) that receive crudes from a pipeline and 4 feed tanks (T-301-T-304) feeding 2 crude units. Transfers happen from the marine and pipeline tanks to the feed tanks. A 4-day schedule from Friday to Monday is shown here. This corresponds to the scenario where the schedule has to be reconciled on a Monday morning after the scheduling instructions were given on the Friday before the weekend. Differences between schedule values and the imported plan values are displayed in FIG. 10A. There are 3 alerts corresponding to the differences in tank volume inventory values for T-102, T-103 and T-301.

Figure 9B:
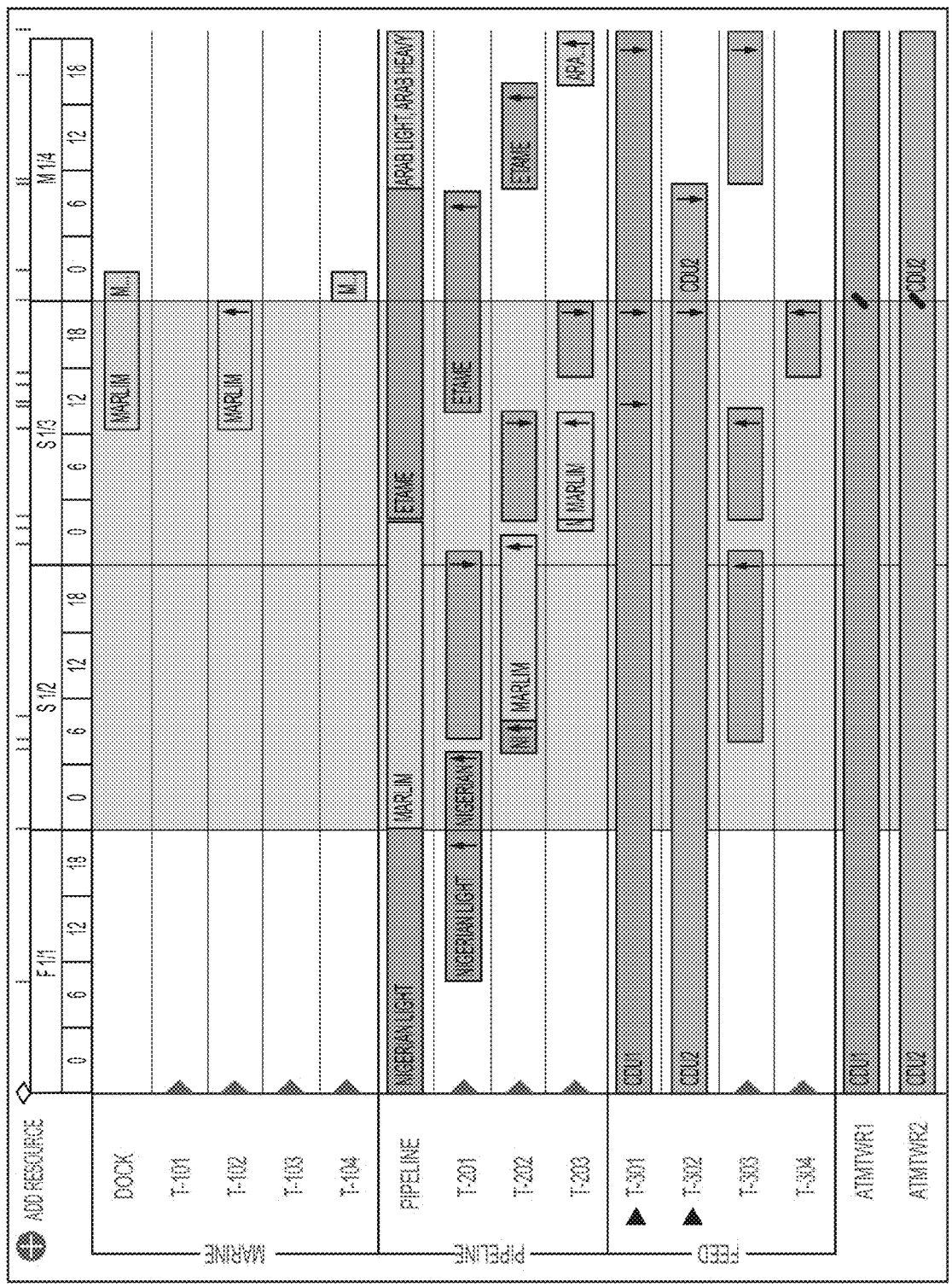
Figure 11A:
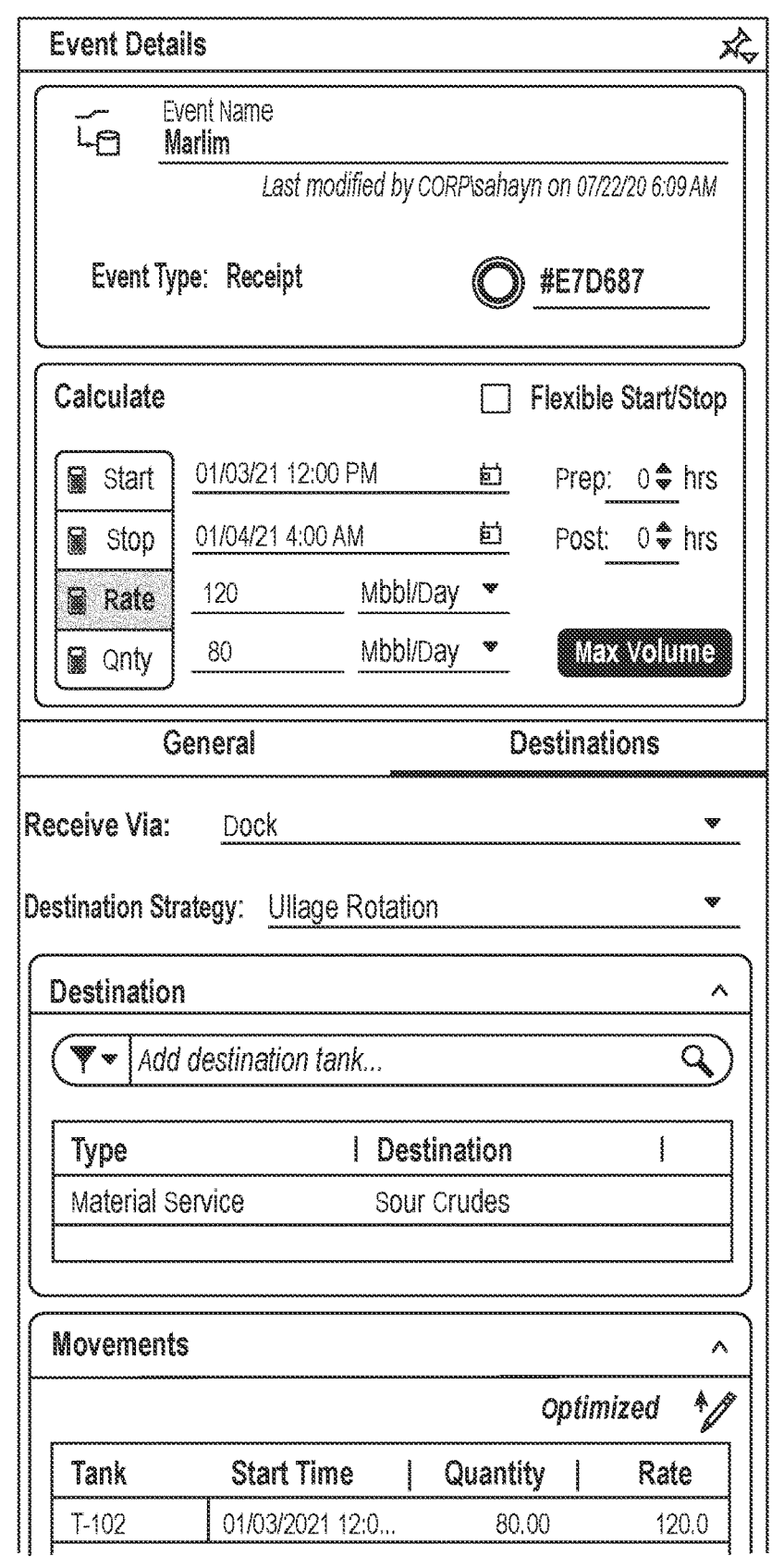

The Gantt chart corresponding to the reconciled schedule is displayed in FIG. 9B. Although it is very similar to the one displayed in FIG. 9A, there are a couple of changes that were made to achieve the baseline values. Firstly, the transfer event from tanks T-103 to T-301 has been deleted. Secondly, the event rate for the receipt event Marlim has been increased from 120 Mbbl/day to approximately 132 Mbbl/day, as indicated in the event details in FIGS. 11A and 11B. Also, since the reconciliation window is only until 12:00 am on 4th January, the receipt Marlim is split at that time. The matching plant and schedule values for the reconciled schedule are shown in FIG. 10B.

Computer Support

Figure 12:
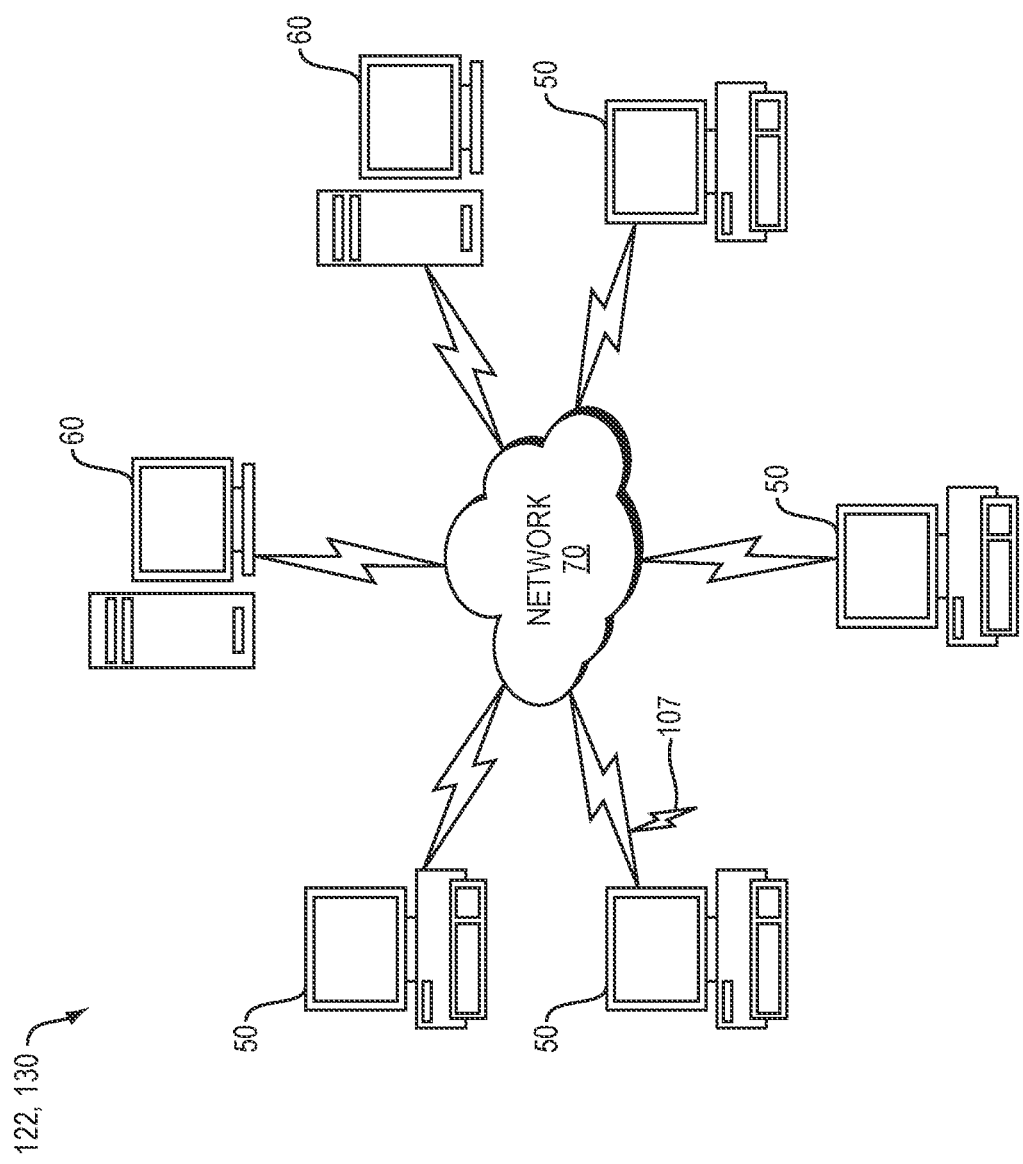
FIG. 12 is a schematic view of a computer network in which embodiments may be implemented.

FIG. 12 illustrates a computer network or similar digital processing environment in which process controllers (generally interfaces) 122 and process modeling systems 130 embodying the present invention may be implemented.

Client computer(s)/devices 50 and server computer(s) 60 provide processing, storage, and input/output devices executing application programs and the like. Client computer(s)/devices 50 can also be linked through communications network 70 to other computing devices, including other client devices/processes 50 and server computer(s) 60. Communications network 70 can be part of a remote access network, a global network (e.g., the Internet), cloud computing servers or service, a worldwide collection of computers, Local area or Wide area networks, and gateways that currently use respective protocols (TCP/IP, Bluetooth, etc.) to communicate with one another. Other electronic device/computer network architectures are suitable.

Figure 13:
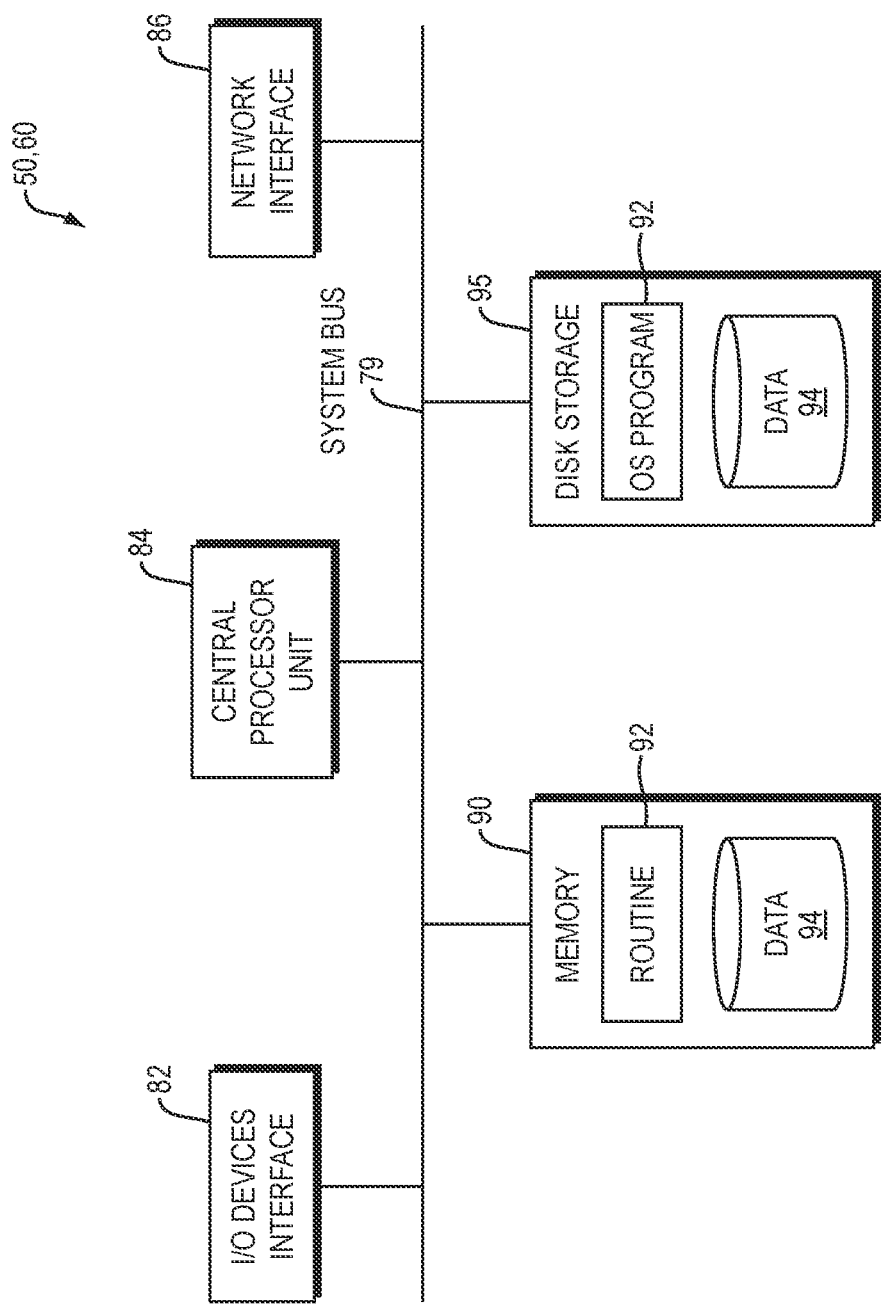
FIG. 13 is a block diagram of a computer node in the network of FIG. 12.

FIG. 13 is a diagram of the internal structure of a computer (e.g., client processor/device 50 or server computers 60) in the computer system of FIG. 12. Each computer 50, 60 contains system bus 79, where a bus is a set of hardware lines used for data transfer among the components of a computer or processing system. Bus 79 is essentially a shared conduit that connects different elements of a computer system (e.g., processor, disk storage, memory, input/output ports, network ports, etc.) that enables the transfer of information between the elements. Attached to system bus 79 is I/O device interface 82 for connecting various input and output devices (e.g., keyboard, mouse, displays, printers, speakers, etc.) to the computer 50, 60. Network interface 86 allows the computer to connect to various other devices attached to a network (e.g., network 70 of FIG. 13). Memory 90 provides volatile storage for computer software instructions 92 and data 94 used to implement an embodiment of the present invention (e.g., hybrid model building methods and systems 100, 500, 700, supporting machine learning models, first principles models, libraries, hybrid models 116, 516, 716, and related data structures and constructs detailed above). Disk storage 95 provides non-volatile storage for computer software instructions 92 and data 94 used to implement an embodiment of the present invention. Central processor unit 84 is also attached to system bus 79 and provides for the execution of computer instructions.

In one embodiment, the processor routines 92 and data 94 are a computer program product (generally referenced 92), including a computer readable medium (e.g., a removable storage medium such as one or more DVD-ROM's, CD-ROM's, diskettes, tapes, etc.) that provides at least a portion of the software instructions for the invention system. Computer program product 92 can be installed by any suitable software installation procedure, as is well known in the art. In another embodiment, at least a portion of the software instructions may also be downloaded over a cable, communication and/or wireless connection. In other embodiments, the invention programs are a computer program propagated signal product 107 embodied on a propagated signal on a propagation medium (e.g., a radio wave, an infrared wave, a laser wave, a sound wave, or an electrical wave propagated over a global network such as the Internet, or other network(s)). Such carrier medium or signals provide at least a portion of the software instructions for the present invention routines/program 92.

In alternate embodiments, the propagated signal is an analog carrier wave or digital signal carried on the propagated medium. For example, the propagated signal may be a digitized signal propagated over a global network (e.g., the Internet), a telecommunications network, or other network. In one embodiment, the propagated signal is a signal that is transmitted over the propagation medium over a period of time, such as the instructions for a software application sent in packets over a network over a period of milliseconds, seconds, minutes, or longer. In another embodiment, the computer readable medium of computer program product 92 is a propagation medium that the computer system 50 may receive and read, such as by receiving the propagation medium and identifying a propagated signal embodied in the propagation medium, as described above for computer program propagated signal product.

Generally speaking, the term "carrier medium" or transient carrier encompasses the foregoing transient signals, propagated signals, propagated medium, storage medium and the like.

In other embodiments, the program product 92 may be implemented as a so called Software as a Service (SaaS), or other installation or communication supporting end-users.

The teachings of all patents, published applications and references cited herein are incorporated by reference in their entirety.

While example embodiments have been particularly shown and described, it will be understood by those skilled in the art that various changes in form and details may be made therein without departing from the scope of the embodiments encompassed by the appended claims.

Computer-based methods and systems in process control, modeling, and simulation use a combination of first principles models and machine learning models to benefit where either model is lacking. In one example, input values (measurements) are adjusted by first principles techniques, and the adjusted values are used to train and generate a machine learning model of the chemical process of interest. In another example, a machine learning model represents the residual (delta) between a first principles model prediction and empirical/observed physical phenomena. Different machine learning models address different physical phenomena. A collection of residual machine learning models improves the accuracy of a first principles model of a chemical process of interest by correcting respective physical phenomena predictions. In yet another example, a machine learning model uses as input, measured values from the chemical process of interest. A first principles simulation model uses the process input data and machine learning predictions of parameters corresponding to specific phenomena. An error correction module determines the error between the simulated results and measured process output values (i.e., plant data). The determined error is used to further train the machine learning model improving predictions that are utilized by the first principles simulator.

Although the forgoing describes and details process control as one application technology area of embodiments of the present invention, there are other technology areas of utilization of Applicant's hybrid models and modeling method/system disclosed herein. Embodiments enable improvement in the performance of the chemical process of interest, such as by: enabling a process engineer to better troubleshoot the chemical process, enabling debottlenecking a portion of the chemical process at the industrial plant, and optimizing (online or offline) performance of the chemical process at the subject industrial plant. Embodiments include process modeling systems, process model simulation systems, and the like.

What is claimed is:

1. A computer-implemented method of process control and schedule reconciliation, comprising:
    receiving by at least one digital processor a scheduling model formed of an initial schedule for reconciliation, the initial schedule having projected plant data for a first period of time regarding at least one chemical process of a subject plant;
    importing, into a memory area accessible by the at least one digital processor, measured plant data for the first period of time regarding the at least one chemical process;
    identifying dynamic optimization data representing trends in plant-wide process production data at time-varied values for key process and operation parameters;
    processing the imported measured plant data and the projected plant data using mathematical modeling techniques and identifying event boundaries, and stream flowrates of materials associated with tanks and process units of the subject plant during the first period of time;
    building an optimization model that mathematically represents a schedule reconciliation problem of processes of the subject plant during the first period of time, the optimization model applying penalties for deviating from: (i) the identified event boundaries during the first period of time, (ii) the identified stream flowrates of materials during the first period of time, (iii) the identified dynamic optimization data, (iv) pre-determined constraints, and (v) the initial schedule for the first period of time, along a period of time that includes priority slots such that solving the optimization model results in a reconciled schedule for the first period of time regarding the at least one chemical process that aligns the projected plant data for the first period of time regarding the at least one chemical process with the measured plant data for the first period of time regarding the at least one chemical process;
    solving the optimization model to develop the reconciled schedule for the first period of time regarding the at least one chemical process, the reconciled schedule having reconciled plant data for the first period of time regarding the at least one chemical process consistent with the identified event boundaries and the identified stream flowrates of materials identified from the processing of the measured plant data and the projected plant data including minimizing deviation from the projected plant data, and providing a current event status, said importing, identifying, processing, building, and solving being automatically performed by the at least one digital processor;
    automatically building a future schedule for a second period of time succeeding the first period of time in computer memory, using the reconciled plant data; and
    controlling the subject plant during the second period of time using the built future schedule by automatically adjusting start time, stop time, and flow rates of tank to tank transfers and of operating modes of the process units.

2. The computer-implemented method of claim 1 wherein the pre-determined constraints include operation constraints.

3. The computer-implemented method of claim 1 wherein the pre-determined constraints include scheduling constraints.

4. The computer-implemented method of claim 1 wherein the pre-determined constraints are further applied across multiple periods.

5. The computer-implemented method of claim 4 wherein reconciling the projected plant data further includes determining the timing of the priority slots within period boundaries.

6. The computer-implemented method of claim 1 wherein the dynamic optimization data is based on reconciliation data obtained once every few minutes.

7. The computer-implemented method of claim 1 wherein the scheduling model and optimization model consist of different types of resources, including transportation modes, tanks, mixers, splitters and production units, that represent corresponding resources in a refinery scheduling operations system.

8. A computer-implemented method of process control and schedule reconciliation, comprising:
- receiving a scheduling model formed of an initial schedule for reconciliation, the initial schedule having projected plant data for a first period of time regarding at least one chemical process of a subject plant;
- importing, into a computer memory area, measured plant data for the first period of time regarding the at least one chemical process;
- processing the imported measured plant data and the projected plant data using mathematical modeling techniques and identifying event boundaries, and stream flowrates of materials associated with tanks and process units of the subject plant during the first period of time;
- importing historical scheduling data into the computer memory area, the historical scheduling data including historical reconciled schedules, and corresponding initial plant data and projected plant data for the historical reconciled schedules;
- processing the imported historical scheduling data to develop machine learning and statistical models to identify key scheduling parameters and decisions;
- building an optimization model that mathematically represents a schedule reconciliation problem of processes of the subject plant during the first period of time, the optimization model applying penalties for deviating from: (i) the identified event boundaries during the first period of time, (ii) the identified stream flowrates of materials during the first period of time, (iii) key scheduling parameters, (iv) pre-determined constraints, and (v) the initial schedule for the first period of time, along a period of time that includes priority slots such that solving the optimization model results in a reconciled schedule for the first period of time regarding the at least one chemical process that aligns the projected plant data for the first period of time regarding the at least one chemical process with the measured plant data for the first period of time regarding the at least one chemical process;
- solving the optimization model to develop the reconciled schedule for the first period of time regarding the at least one chemical process, the reconciled schedule having reconciled plant data for the first period of time regarding the at least one chemical process consistent with the identified event boundaries and the identified stream flowrates of materials identified from the processing of the measured plant data and the projected plant data including minimizing deviation from the projected plant data and providing a current event status, said importing, identifying, processing, building, and solving being automatically performed by at least one digital processor;
- automatically building a future schedule for a second period of time succeeding the first period of time in computer memory, using the reconciled plant data; and
- controlling the subject plant during the second period of time using the future schedule by automatically adjusting start time, stop time, and flow rates of tank to tank transfers and of operating modes of the process units.

9. The computer-implemented method of claim 8 wherein the pre-determined constraints include operation constraints.

10. The computer-implemented method of claim 8 wherein the pre-determined constraints include scheduling constraints.

11. The computer-implemented method of claim 8 wherein the pre-determined constraints are further applied across multiple periods of priority slots.

12. The computer-implemented method of claim 11 wherein reconciling the projected plant data further includes determining the timing of the priority slots within period boundaries.

13. The computer-implemented method of claim 8 wherein the scheduling model and optimization model consist of different types of resources, including transportation modes, tanks, mixers, splitters and production units, that represent corresponding resources in a refinery scheduling operations system.

14. A computer-implemented method of process control and schedule reconciliation, comprising:
- receiving by at least one digital processor a scheduling model formed of an initial schedule for reconciliation, the initial schedule having projected plant data for a first period of time regarding at least one chemical process of a subject plant;
- importing, into a memory area accessible by the at least one digital processor, measured plant data for the first period of time regarding the at least one chemical process;
- identifying dynamic optimization data representing trends in plant-wide process production data at time varied values for key process parameters;
- processing the imported measured plant data and the projected plant data using mathematical modeling techniques and identifying event boundaries, and stream flowrates of materials associated with tanks and process units of the subject plant during the first period of time;
- importing historical scheduling data into the memory area; the historical scheduling data having historical reconciled schedules and their corresponding initial state data and projected state data for the historical reconciled schedules;
- processing the imported historical scheduling data to develop machine learning and statistical models to identify key scheduling parameters;
- building an optimization model that mathematically represents a schedule reconciliation problem of processes of the subject plant during the first period of time, the optimization model applying penalties for deviating from: (i) the identified event boundaries during the first period of time, (ii) the identified stream flowrates of materials during the first period of time, (iii) the identified dynamic optimization data, (iv) key scheduling parameters and pre-determined constraints, and (v) the initial schedule for the first period of time, along a period of time that includes priority slots such that solving the optimization model results in a reconciled schedule for the first period of time regarding the at least one chemical process that aligns the projected plant data for the first period of time regarding the at least one chemical process with the measured plant data for the first period of time regarding the at least one chemical process;

solving the optimization model to develop the reconciled schedule for the first period of time regarding the at least one chemical process, the reconciled schedule having reconciled plant data for the first period of time regarding the at least one chemical process consistent with the identified event boundaries and the identified stream flowrates of materials identified from the processing of the measured plant data and the projected plant data including minimizing deviation from the projected plant data, and providing a current event status, said importing, identifying, processing, building, and solving being automatically performed by the at least one digital processor;

automatically building a future schedule for a second period of time succeeding the first period of time, using the reconciled plant data; and controlling the subject plant during the second period of time using the future schedule by automatically adjusting start time, stop time, and flow rates of tank to tank transfers and of operating modes of the process units.

15. A computer-based process modeling and simulation system, comprising:

a modeling subsystem performing schedule reconciliation on a chemical process of a subject industrial plant, the modeling subsystem (i) receiving by at least one digital processor a scheduling model formed of an initial schedule for reconciliation, the initial schedule having projected plant data for a first period of time regarding the chemical process of the subject plant, (ii) importing, into a memory area accessible by the at least one digital processor, measured plant data for the first period of time regarding the chemical process, (iii) identifying dynamic optimization data representing trends in plant-wide process production data at time varied values for key process parameters; (iv) processing the imported measured plant data and projected plant data using mathematical modeling techniques and identifying event boundaries, and stream flowrates properties associated with tanks and process units of the subject plant during the first period of time, (v) importing historical scheduling data into the memory area; the historical scheduling data having historical reconciled schedules and their corresponding initial state data and projected state data, (vi) processing the imported historical scheduling data to develop machine learning and statistical models to identify key scheduling parameters; (vii) building an optimization model that mathematically represents a schedule reconciliation problem of processes of the subject plant during the first period of time, the optimization model applying penalties for deviating from: (a) the identified event boundaries during the first period of time, (b) the identified stream flowrates of materials during the first period of time, (c) the identified dynamic optimization data, (d) key scheduling parameters and pre-determined constraints, (e) the initial schedule for the first period of time, along a period of time that includes priority slots such that solving the optimization model results in a reconciled schedule for the first period of time regarding the at least one chemical process that aligns the projected plant data for the first period of time regarding the chemical process with the measured plant data for the first period of time regarding the chemical process, and (viii) solving the optimization model to develop the reconciled schedule for the first period of time regarding the at least one chemical process having reconciled plant data for the first period of time regarding the chemical process, the reconciled plant data consistent with the identified event boundaries and the identified stream flowrates of materials identified from the processing of the measured plant data and the projected plant data including minimizing deviation from the projected plant data, and providing a current event status, said importing, identifying, processing, building, and solving being automatically performed by the at least one digital processor and;

an interface coupled to the modeling subsystem in a manner that enables improvements in performance of the processes of the subject industrial plant by automatically adjusting start time, stop time, and flow rates of tank to tank transfers and of operating modes of the process units based on a future schedule for a second period of time succeeding the first period of time, automatically built using the reconciled plant data, to control the processes of the subject plant during the second period of time.

* * * * *